US012765316B2

(12) United States Patent
Yoon et al.

(10) Patent No.: US 12,765,316 B2

(45) Date of Patent: Oct. 13, 2026

(54) TEACHING METHOD

(71) Applicants: SEMES CO., LTD., Cheonan-si (KR); Samsung Electronics Co., Ltd., Suwon-si (KR)

(72) Inventors: Kisub Yoon, Cheonan-si (KR); Dongpil Kang, Cheonan-si (KR); Kiyong Lee, Suwon-si (KR); Chunghyuk You, Yongin-si (KR)

(73) Assignees: Semes Co., Ltd., Chungcheongnam-do (KR); Samsung Electronics Co., Ltd., Gyeonggi-do (KR)

( * ) Notice: Subject to any disclaimer, the term of this patent is extended or adjusted under 35 U.S.C. 154(b) by 468 days.

(21) Appl. No.: 18/349,668

(22) Filed: Jul. 10, 2023

(65) Prior Publication Data

US 2024/0030052 A1 Jan. 25, 2024

(30) Foreign Application Priority Data

Jul. 22, 2022 (KR) ........................ 10-2022-0090881

(51) Int. Cl.

*H01L 21/677* (2006.01)
*H01L 21/67* (2006.01)
(Continued)

(52) U.S. Cl.

CPC ...... *H10P 72/3214* (2026.01); *H10P 72/0606* (2026.01); *H10P 72/3222* (2026.01)

(58) Field of Classification Search

CPC ......... H01L 21/67724; H01L 21/67259; H01L 21/67736; H01L 21/67733; H01L 21/681;
(Continued)

(56) References Cited

U.S. PATENT DOCUMENTS 6,092,678 A 7/2000 Kawano et al.
7,558,645 B2 7/2009 Shiwaku et al.
(Continued)

FOREIGN PATENT DOCUMENTS

JP 5339165 B2 11/2013
JP 6146537 B2 6/2017
(Continued)

OTHER PUBLICATIONS

Korean Notice of Allowance dated Sep. 10, 2024 issued in corresponding Korean Appln. No. 10-2022-0090881.

*Primary Examiner* — Charles R Kasenge

(74) *Attorney, Agent, or Firm* — Harness, Dickey & Pierce, P.L.C.

(57) ABSTRACT

In a teaching method, a vehicle, which travels along a traveling rail, is allowed to arrive at a reference loading/unloading position adjacent to a reference seating surface having a reference QR code displayed thereon. A first image corresponding to the reference seating surface is acquired at the reference loading/unloading position. The vehicle, which further travels along the traveling rail, is allowed to arrive at a target loading/unloading position adjacent to the target seating surface having a target QR code displayed thereon. A second image corresponding to the target seating surface is acquired at the target loading/unloading position. The first image and the second image are compared with each other to acquire n X-axial directional teaching relative value and a Y-axis directional teaching relative value.

10 Claims, 5 Drawing Sheets

(51) Int. Cl.
*H10P 72/00* (2026.01)
*H10P 72/30* (2026.01)

(58) Field of Classification Search
CPC ..... H01L 21/67294; B25J 5/02; B25J 9/1664; B25J 9/1697
See application file for complete search history.

(56) References Cited

U.S. PATENT DOCUMENTS

| | | | |
|---|---|---|---|
| 8,374,420 B2 | 2/2013 | Murakami | |
| 8,457,788 B2 | 6/2013 | Asakawa et al. | |
| 11,027,949 B2 | 6/2021 | Wada | |
| 2012/0175334 A1 | 7/2012 | Chen et al. | |
| 2020/0207250 A1* | 7/2020 | Jarvis | G01C 21/3623 |
| 2020/0399060 A1* | 12/2020 | Whelan | G05D 1/0246 |

FOREIGN PATENT DOCUMENTS

| | | | |
|---|---|---|---|
| KR | 10-2009-0093833 | A | 9/2009 |
| KR | 10-2012-0133031 | A | 12/2012 |
| KR | 101539316 | B1 | 7/2015 |
| KR | 10-2015-0119183 | A | 10/2015 |
| KR | 101626374 | B1 | 6/2016 |
| KR | 102202077 | B1 | 1/2021 |
| KR | 102242361 | B1 | 4/2021 |
| KR | 10-2022-0091979 | A | 7/2022 |
| KR | 102460311 | B1 | 10/2022 |

* cited by examiner

TEACHING METHOD

CROSS-REFERENCE TO RELATED APPLICATION

This application claims priority under 35 USC § 119 to Korean Patent Application No. 10-2022-0090881 filed on Jul. 22, 2022 in the Korean Intellectual Property Office (KIPO), the entire disclosure of which is incorporated herein by reference.

BACKGROUND

1. Field

Example embodiments relate to a teaching method. More specifically, Example embodiments relate to a teaching method for a vehicle to teach a position of the vehicle for loading or unloading a target.

2. Description of the Related Art

In general, a semiconductor device may be fabricated by repeatedly performing various processes, such as a deposition process, a photolithography process, an etching process, etc. on a substrate such as a silicon wafer. In the semiconductor fabricating processes, the substrate may be transferred between process facilities by an overhead transport device such as an overhead hoist transport (OHT) device. In addition, various types of materials as well as the silicon wafer may be transferred by the OHT device, thereby implementing the automation of the fabricating processes.

For example, the OHT device may include a vehicle configured to be movable along a traveling rail disposed on the ceiling of a clean room and the vehicle may include a hand unit to grip a storage container, such as a front opening unified pod (FOUP) where targets, for example, a plurality of substrates are accommodated.

In particular, the traveling rails may be provided along preset paths on the ceiling of the clean room, and the vehicle may include a traveling unit that travels along the traveling rail. In addition, the vehicle may include a hoist unit to move up and down a hand unit, and the hand unit may be suspended to the hoist unit through a plurality of belts.

Meanwhile, in order to use the OHT device, a teaching work is required to allow the vehicle to load or unload the targets.

SUMMARY

Example embodiments provide a teaching method capable of improving the precision of teaching.

According to example embodiments, in a teaching method, a vehicle, which travels along a traveling rail, is allowed to arrive at a reference loading/unloading position adjacent to a reference seating surface having a reference QR code displayed thereon. A first image corresponding to the reference seating surface is acquired at the reference loading/unloading position. The vehicle, which further travels along the traveling rail, is allowed to arrive at a target loading/unloading position adjacent to a target seating surface having a target QR code displayed thereon. A second image corresponding to the target seating surface is acquired at the target loading/unloading position. The first image and the second image are compared with each other to acquire an X-axial directional teaching relative value and a Y-axis directional teaching relative value.

In example embodiments, the X-axis directional teaching relative value may be acquired based on a value obtained by subtracting a1 indicating an X-axis coordinate of the reference QR code shown on the first image from a2 indicating an X-axis coordinate of the target QR code shown on the second image.

In example embodiments, the Y-axis directional teaching relative value may be acquired based on a value obtained by subtracting b1 indicating a Y-axis coordinate of the reference QR code shown on the first image from b2 indicating a Y-axis coordinate of the target QR code shown on the second image.

In example embodiments, the teaching method may further include acquiring an X-axis directional target teaching value by adding an X-axis directional teaching relative value to an X-axis directional default value.

In example embodiments, the teaching method may further include acquiring a Y-axis directional target teaching value by adding a Y-axis directional teaching relative value to a Y-axis directional default value.

In example embodiments, the teaching method may further include sensing a Y-axis directional target tilting angle, and correcting the Y-axis directional target teaching value based on the Y-axis directional target tilting angle to acquire a Y-axis directional target correction teaching value. The Y-axis directional target correction teaching value may satisfy a following Equation.

$$Y'_{teaching} = \frac{Y_{teaching}}{\cos\theta}, \quad \text{Equation}$$

wherein, $$Y'_{teaching}$$

denotes the Y-axis directional target correction teaching value, $Y_{teaching}$ denotes the Y-axis directional target teaching value, and θ denotes the Y-axis directional target tilting angle.

In example embodiments, the teaching method may further include acquiring a Z-axis directional target teaching value preset in the target QR code by scanning the target QR code, after acquiring the second image In example embodiments, a real size of the target QR code may vary depending on a height of the target seating surface.

In example embodiments, the teaching method may further include acquiring the real size of the target QR code shown on the second image and acquiring a Z-axis directional target teaching value corresponding to the real size of the target QR code, after acquiring the second image.

According to example embodiments, in a teaching method, a vehicle, which travels along a traveling rail, is allowed to arrive at a reference loading/unloading position adjacent to a reference seating surface having a reference QR code displayed thereon. A first image corresponding to the reference seating surface is acquired at the reference loading/unloading position. The vehicle, which further travels along the traveling rail, is allowed to arrive at a target loading/unloading position adjacent to the target seating surface having a target QR code displayed thereon. A second image corresponding to the target seating surface is acquired at the target loading/unloading position. The first image and the second image may be compared with each other to acquire n X-axial directional teaching relative value and a Y-axis directional teaching relative value. A Y-axis directional target teaching value may be corrected based on a preset Z-axis directional target average value and a preset Z-axis directional target real value to acquire a Y-axial directional target correction teaching value.

According to the teaching method of the vehicle of the embodiment of the present disclosure, the target teaching values can be rapidly acquired without the help of a worker.

However, the effects of the present disclosure are not limited to the above-mentioned effects, and may be expanded in various ways without departing from the spirit and scope of the present disclosure.

BRIEF DESCRIPTION OF THE DRAWINGS

Example embodiments will be more clearly understood from the following detailed description taken in conjunction with the accompanying drawings.

FIGS. 1 and 2 are views illustrating a vehicle to be transferred according to a teaching method in accordance with example embodiments.

FIG. 3 is a plan view illustrating a reference loading/unloading position and a target loading/unloading position where a vehicle of FIG. 1 can be located.

FIG. 4 is a view illustrating a first image acquired when a vehicle of FIG. 1 is located at a reference loading/unloading position of FIG. 3.

FIG. 5 is a view illustrating a second image acquired when a vehicle of FIG. 1 is located at a target loading/unloading position of FIG. 3.

FIG. 6 is a view for comparing FIGS. 4 and 5.

FIG. 7 is a view for explaining a Y-axis directional target correction teaching value.

DETAILED DESCRIPTION OF THE EMBODIMENTS

Figure 1:
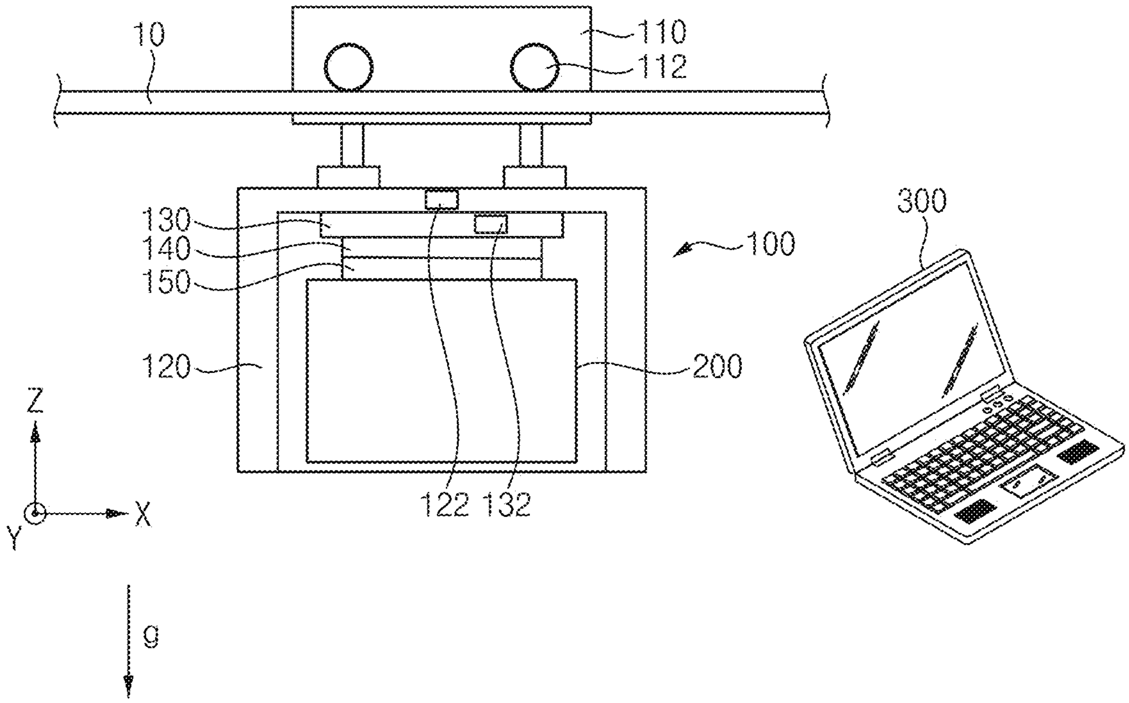
FIGS. 1 to 7 represent non-limiting, example embodiments as described herein.

Hereinafter, example embodiments will be explained in detail with reference to the accompanying drawings.

Example embodiments may be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of components or elements may be exaggerated for clarity. It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in more detail with reference to the accompanying drawings. The same reference numerals will be used for the same elements in the drawings, and redundant descriptions of the same elements will be omitted.

Figure 2:
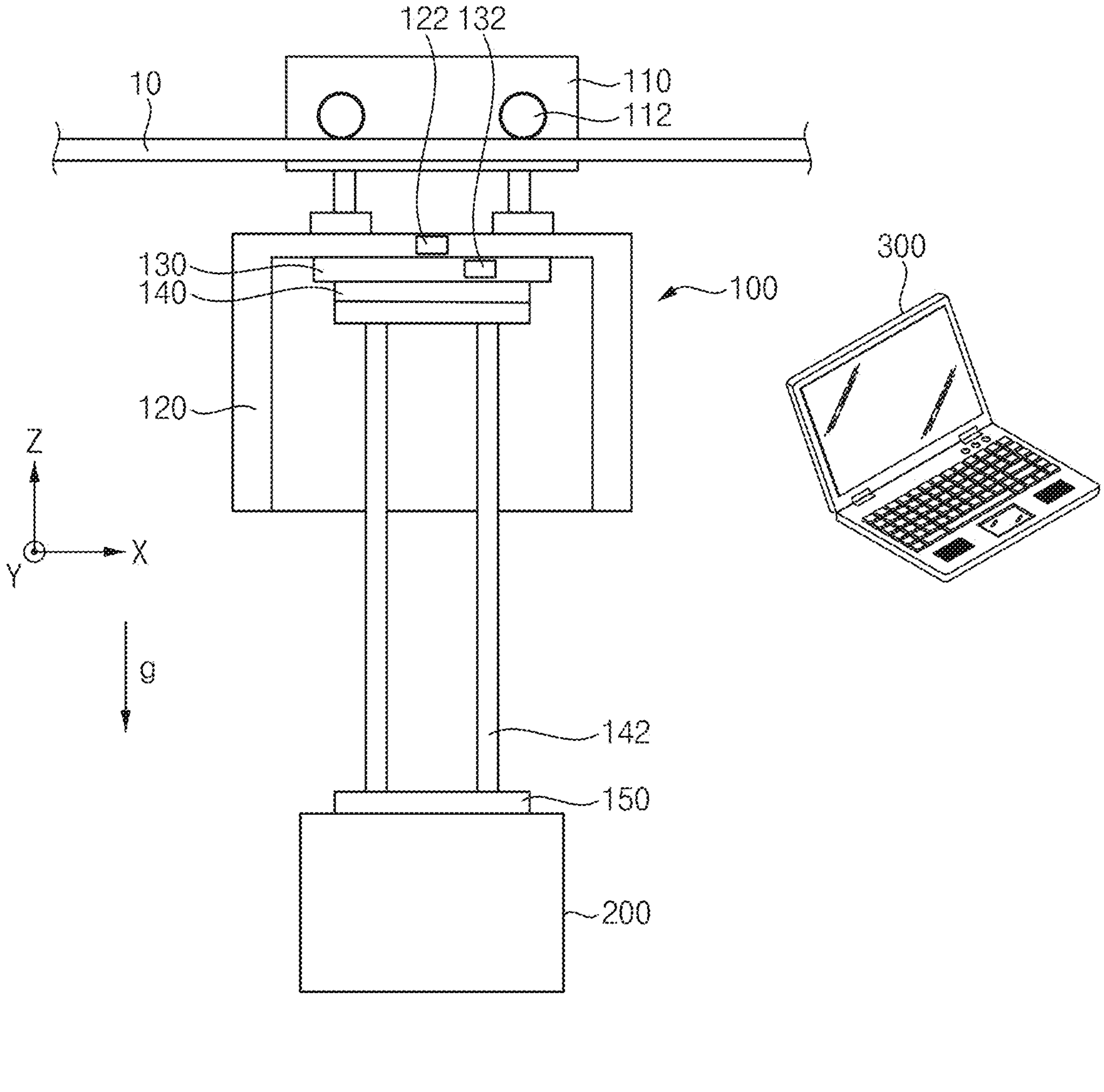

FIGS. 1 and 2 are views illustrating a vehicle to be transferred according to a teaching method in accordance with example embodiments.

Referring to FIGS. 1 and 2, a teaching method according to example embodiments may be used to teach a position of a vehicle 100 for loading/unloading a target 200. The target 200 may be transferred by the vehicle 100. The target may include an FOUP, an FOSB, a magazine, or an EUV pod.

Hereinafter, the vehicle 100 will be described prior to describing the teaching method in detail.

The vehicle 100 may include a driving unit 110, a frame unit 120, a slide unit 130, a hoist unit 140, and a hand unit 150, and may grip and transfer the target 200.

The driving unit 110 may move along a traveling rail 10. The driving unit 110 may include driving wheels 112 provided on opposite side surfaces of the driving unit 110. The driving wheel 112 may be driven to be rotated by a separate driving unit. Accordingly, the vehicle 100 may travel along the traveling rail 10. For example, the vehicle 100 may move in an X-axis direction.

In example embodiments, the X-axis direction may be perpendicular to a gravity direction g.

Meanwhile, the driving unit 110 may include a steering roller (not shown) provided on a top surface thereof. The steering roller may selectively make contact with a steering rail (not shown) provided above the traveling rail 10. Accordingly, the traveling direction of the vehicle 100 may be controlled at a branch point of the traveling rail 10.

The frame unit 120 may be fixed to a bottom surface of the driving unit 110. The frame unit 120 may have a hollow inner space to receive the target. In addition, a bottom surface and one side surface provided in a Y-axis direction of the frame unit 120 may be open, such that the target is movable in the Y-axis direction and a Z-axis direction.

In example embodiments, the Y-axis direction may be perpendicular to the X-axis direction and the gravity direction (g).

In addition, the frame unit 120 may have an image acquiring portion 122. Detailed descriptions thereof will be provided below.

The slide unit 130 may be provided on an inner top surface of the frame unit 120. The slide unit 130 may move the hoist unit 140 horizontally in the Y-axis direction. In this case, the hoist unit 140 may horizontally move through the open one side surface of the frame unit 120.

In addition, the slide unit 130 may have a gradient sensor 132. Detailed descriptions thereof will be provided later.

The hoist unit 140 may be provided to be movable horizontally in the Y-axis direction on a bottom surface of the slide unit 130. The hoist unit 140 may wind or unwind a belt 142 as illustrated in FIG. 2 to move up and down the hand unit 150.

The hand unit 150 may be fixed to an end portion of the belt 142 and may hold the target. The target may move in the Y-axis direction by the slide unit 130, and may move up and down by the hoist unit 140.

Meanwhile, the vehicle 100 may communicate with a controller 170. Detailed descriptions thereof will be provided below.

Figure 3:
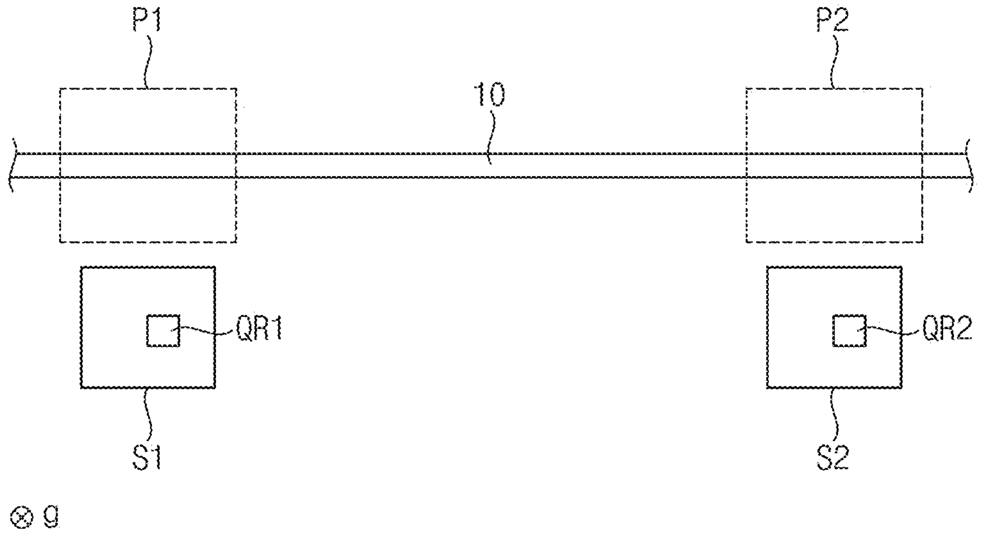
Figure 4:
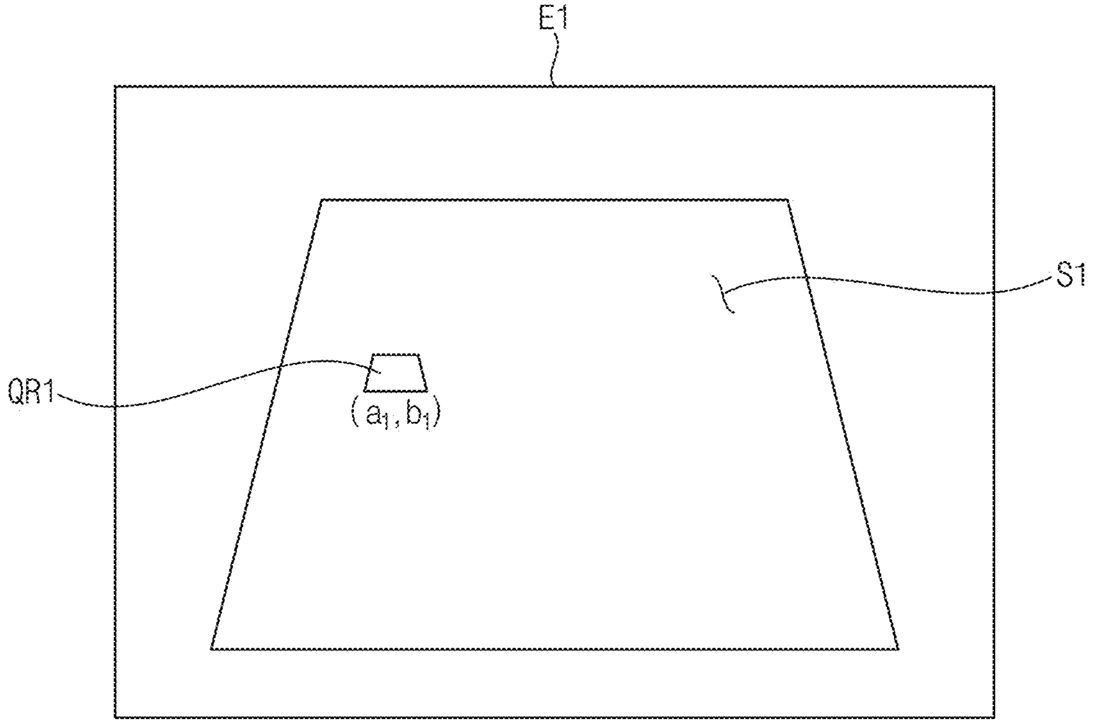
Figure 5:
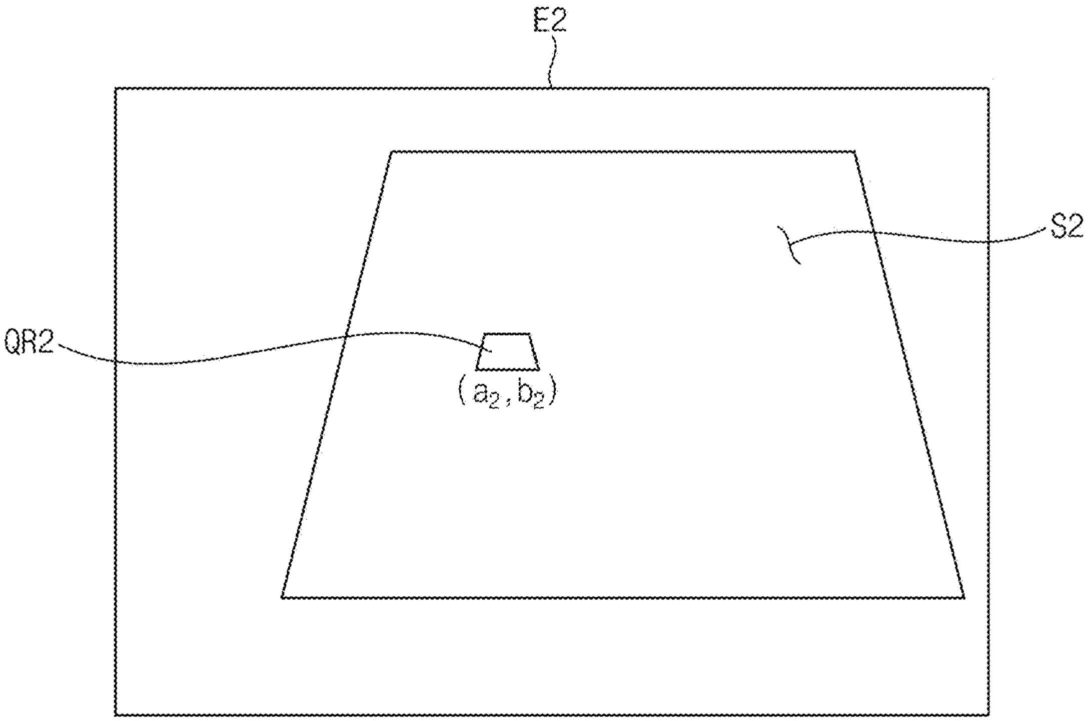
Figure 6:
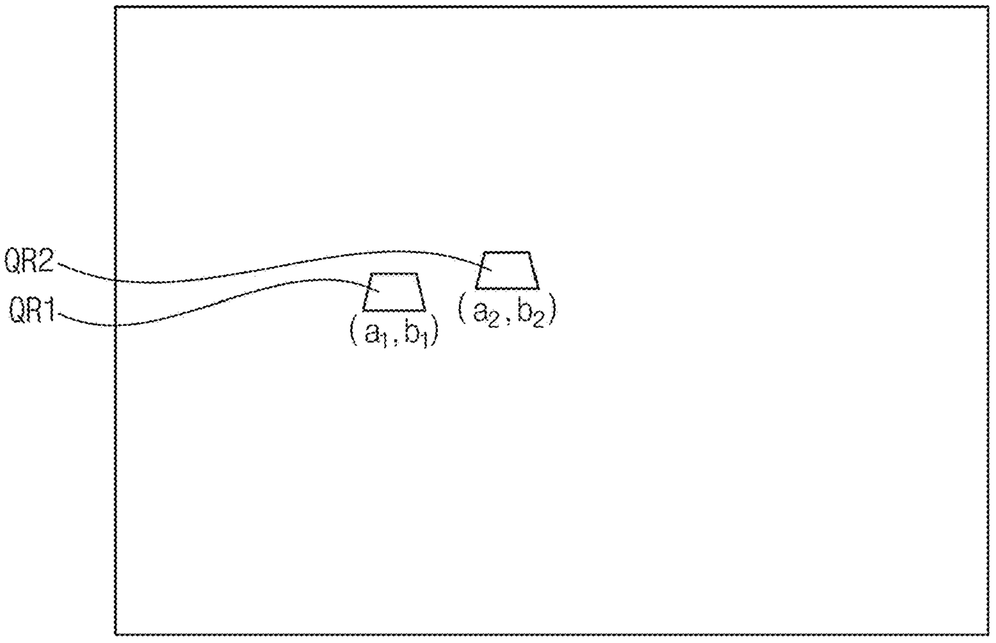

FIG. 3 is a plan view illustrating a reference loading/unloading position and a target loading/unloading position where the vehicle of FIG. 1 can be located, FIG. 4 is a view illustrating a first image acquired when the vehicle of FIG. 1 is located at the reference loading/unloading position of FIG. 3, FIG. 5 is a view illustrating a second image acquired when the vehicle of FIG. 1 is located at the target loading/unloading position of FIG. 3, and FIG. 6 is a view for comparing FIGS. 4 and 5.

The teaching method may be explained with reference to FIGS. 1 to 6.

Hereinafter, the teaching method will be described following the description of the vehicle 100.

First, the vehicle 100 may travel along the traveling rail 10 and may arrive at a reference loading/unloading position P1 adjacent to a reference seating surface S1 that has a reference QR code QR1 displayed thereon.

Then, a first image E1 corresponding to the reference seating surface S1 may be obtained at the reference loading/unloading position P1. For example, the frame unit 120 of the vehicle 100 may have the image acquiring unit 122, and when the vehicle 100 arrive at the reference loading/unloading position P1, the image acquiring unit 122 may photograph the reference seating surface S1 to acquire the first image E1. Accordingly, as illustrated in FIG. 4, the reference QR code QR1 may be shown on the first image E1.

In example embodiments, the image acquiring unit 122 may include a camera.

Then, the vehicle 100 may further travel along the traveling rail 10 and may arrive at the target loading/unloading position P2 adjacent to a target seating surface S2 that has a target QR code QR2 displayed thereon.

Although FIG. 3 illustrates that the target loading/unloading position P2 and the reference loading/unloading position P1 are connected by a straight path, it may not be limited thereto. For example, the target loading/unloading position P2 and the reference loading/unloading position P1 may be connected by a curved path, or the target loading/unloading position P2 and the reference loading/unloading position P1 may be connected by a combination of the straight path and the curved path.

Then, a second image E2 corresponding to the target seating surface S2 may be acquired at the target loading/unloading position P2. For example, the frame unit 120 of the vehicle 100 may have the image acquiring unit 122, and when the vehicle 100 arrives at the target loading/unloading position P2, the image acquiring unit 122 may photograph the target seating surface S2 to acquire the second image E2. Accordingly, as illustrated in FIG. 5, the target QR code QR2 may be shown on the second image E2.

Then, target teaching values may be acquired. In this case, the target teaching values may be classified as an X-axis directional target teaching value ($X_{teaching}$), a Y-axis directional target teaching value ($Y_{teaching}$), and a Z-axis directional target teaching value ($Z_{teaching}$).

[Method of Acquiring X-Axis Directional Target Teaching Value ($X_{teaching}$)]

Hereinafter, a method of acquiring the X-axis directional target teaching value ($X_{teaching}$) based on a time point after acquiring the second image E2 will be described.

First, as illustrated in FIG. 6, an X-axis directional teaching relative value ($X_\Delta$) may be acquired by comparing a first mage (for example, the first image E1 of FIG. 4) with a second image (for example, the second mage E2 of FIG. 5).

For example, the vehicle 100 may communicate with the controller 300, and the controller 300 may compare the first image with the second image to acquire the X-axis directional teaching relative value ($X_\Delta$).

In particular, the X-axis directional teaching relative value ($X_\Delta$) may be acquired based on a value obtained by subtracting 'a1' indicating an X-axis coordinate of the reference QR code QR1 shown on the first image from 'a2' indicating an X-axis coordinate of the target QR code QR2 shown on the second image.

In example embodiments, the reference seating surface S1 may be referred to as an origin port, and the value of 'a1' may be zero.

The X-axis directional teaching relative value ($X_\Delta$) may satisfy following Equation 1.

$$X_\Delta = C_1(a_2 - a_1), \text{ where } c_1 \text{ is constant.} \qquad \text{Equation 1}$$

The proportional constant ($c_1$) used in Equation 1 may be acquired based on experiences repeated by a predetermined number of times, and those skilled in the art may easily acquire the proportional constant ($c_1$) based on the description of the present disclosure.

Then, the X-axis directional target teaching value ($X_{teaching}$) may be acquired by adding the X-axis directional teaching relative value ($X_\Delta$) to an X-axis directional default value ($X_{default}$).

In example embodiments, the reference seating surface S1 may be referred to as the origin port, and the X-axis default value ($X_{default}$) may be a preset teaching value in the X-axis direction from the origin port.

The X-axis directional target teaching value ($X_{teaching}$) may satisfy following Equation 2.

$$X_{teaching} = X_{default} + X_\Delta \qquad \text{Equation 2}$$

[Method of Acquiring Y-Axis Directional Target Teaching Value ($Y_{teaching}$) and Correction Value $$\left(Y''_{teaching}\right)$$

Thereof]

Hereinafter, a method of acquiring the Y-axis directional target teaching value ($Y_{teaching}$) and a correction value $$\left(Y'_{teaching}\right)$$

thereof based on a time point after acquiring the second image E2 will be described.

First, as illustrated in FIG. 6, a Y-axis directional teaching relative value (YA) may be acquired by comparing a first image (for example, the first image E1 of FIG. 4) with a second image (for example, the second image E2 of FIG. 5).

For example, the vehicle 100 may communicate with the controller 300, and the controller 300 may compare the first image with the second image to acquire the Y-axis directional teaching relative value ($Y_\Delta$).

In particular, the Y-axis directional teaching relative value ($Y_\Delta$) may be acquired based on a value obtained by subtracting '$b_1$' indicating an Y-axis coordinate of the reference QR code QR1 shown on the first image from '$b_2$' indicating an Y-axis coordinate of the target QR code QR2 shown on the second image.

In example embodiments, the reference seating surface S1 may be referred to as an origin port, and the value of '$b_1$' may be zero.

The Y-axis directional teaching relative value ($Y_\Delta$) may satisfy following Equation 3.

$$Y_\Delta = C_2(b_2 - b_1), \text{ where } c_2 \text{ is constant.} \qquad \text{Equation 3}$$

The proportional constant ($c_2$) used in Equation 3 may be acquired based on experiences repeated by a predetermined number of times, and those skilled in the art may easily acquire the proportional constant ($c_2$) based on the description of the present disclosure.

Then, the Y-axis directional target teaching value ($Y_{teaching}$) may be acquired by adding the X-axis directional teaching relative value ($Y_\Delta$) to a Y-axis directional default value ($Y_{default}$).

In example embodiments, the reference seating surface S1 may be referred to as the origin port, and the Y-axis default value ($Y_{default}$) may be a preset teaching value in the Y-axis direction at the origin port.

The Y-axis directional target teaching value ($Y_{teaching}$) may satisfy following Equation 4.

$$Y_{teaching} = Y_{default} + Y_\Delta \qquad \text{Equation 4}$$

Then, a Y-axis directional target tilting angle ($\theta_Y$) may be sensed. For example, the slide unit 130 of the vehicle 100 may have the gradient sensor 132 and the gradient sensor 132 may sense the Y-axis directional target tilting angle ($\theta_Y$).

In example embodiments, the Y-axis directional target tilting angle ($\theta_Y$) may be about 1°.

Then, the Y-axis directional target teaching value ($Y_{teaching}$) may be corrected based on the Y-axis directional target tilting angle ($\theta_Y$) to obtain a Y-axis directional target correction teaching value $$(Y'_{teaching}).$$

Figure 7:
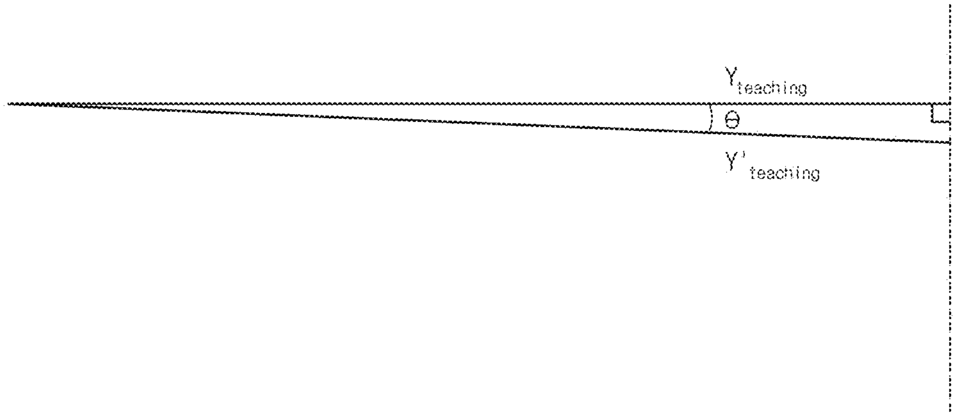

FIG. 7 is a view illustrating a Y-axis directional target correction teaching value.

Referring to FIG. 7, the Y-axis directional target correction teaching value ($Y'_{teaching}$) may satisfy following Equation 5.

$$Y'_{teaching} = \frac{Y_{teaching}}{\cos\theta} \qquad \text{Equation 5}$$

[Method of Acquiring Z-Axis Directional Target Teaching Value ($Z_{teaching}$)]

Hereinafter, a method of acquiring the Z-axis directional target teaching value ($Z_{teaching}$) based on a time point after acquiring the second image E2 of the FIG. 5 will be described.

The Z-axis direction target teaching value ($Z_{teaching}$) may be preset in the target QR code, for example, the target QR code QR2 of FIG. 5. That is, the Z-axis direction target teaching value ($Z_{teaching}$) may be obtained by scanning the target QR code.

Conventionally, manual work of an operator has been performed to acquire target teaching values. Therefore, not only the labor of the worker was required, but also a lot of time was required to obtain the target teaching value.

However, according to the teaching method of the present disclosure, the target teaching values may be rapidly acquired without the help of the worker.

Hereinafter, a teaching method according to another embodiment will be described. However, the duplication description will be omitted, and the method of acquiring the Y-axis directional target teaching value ($Y_{teaching}$) and a correction value $$(Y''_{teaching})$$

of the Y-axis directional target teaching value ($Y_{teaching}$) will be described in detail.

[Method of Acquiring Y-Axis Directional Target Teaching Value ($Y_{teaching}$) and Correction Value $$(Y''_{teaching})$$

of the Y-Axis Directional Target Teaching Value ($Y_{teaching}$)]

Hereinafter, a method of acquiring the Y-axis directional target teaching value ($Y_{teaching}$) and a correction value $$(Y''_{teaching})$$

of the Y-axis directional target teaching value ($Y_{teaching}$) will be described based on a time point after acquiring the second image (for example, the second image E2 of FIG. 5).

First, as illustrated in FIG. 6, an Y-axis directional teaching relative value (YA) may be acquired by comparing the first image (for example, the first image E1 of FIG. 4) with the second image (for example, the second image E2 of FIG. 5) of FIG. 4.

Then, the Y-axis directional target teaching value ($Y_{teaching}$) may be acquired by adding the Y-axis directional teaching relative value ($Y_\Delta$) to the Y-axis directional default value ($Y_{default}$).

In this case, referring again to FIGS. 3 and 5, it may be understood that a direction of photographing the target seating surface S2 by the image acquiring unit 122 may be a direction crossing the gravity direction g, when the second image E2 corresponding to the target seating surface S2 is acquired at the target loading/unloading position P2.

When the second image E2 corresponding to the target seating surface S2 is acquired at the target loading/unloading position P2, the direction of photographing the target seating surface S2 by the image acquiring unit 122 may be the same as the gravity direction g.

However, the following description will be made on the assumption that the direction of photographing the target seating surface S2 by the image acquiring unit 122 is the direction crossing the gravity direction g, when the second mage E2 corresponding to the target seating surface S2 is acquired at the target loading/unloading position P2 in the teaching method according to another embodiment of the present disclosure.

A plurality of the target seating surfaces S2 may be provided, and a Z-axis direction target real value ($Z_{real}$) may be present for each target seating surface S2.

In addition, the Z-axis direction target real value ($Z_{real}$) may be referred to as a real movement distance of the target 200 that moves in the gravity direction g until the target 200 arrives at the target seating surface S2.

In addition, the target seating surface S2 may include a first target seating surface, a second target seating surface, . . . , and an $N_{th}$ target seating surface (N is a natural number equal to or greater than '3').

In this case, a value obtained by dividing the sum of a Z-axis directional target real value ($Z_{real,\ 1}$) on the first target seating surface, a Z-axis directional target real value ($Z_{real,\ 2}$) on the second target seating surface, . . . , and a Z-axis directional target real value ($Z_{real,\ N}$) on the $N_{th}$ target seating surface by N may be defined as a Z-axis directional target average value ($Z_{real,\ ave}$).

The Z-axis directional target real value ($Z_{real,\ 1}$) on the first target seating surface, the Z-axis directional target real value ($Z_{real,\ 2}$) on the second target seating surface, . . . and the Z-axis directional target real value ($Z_{real,\ N}$) on the $N_{th}$ target seating surface may be preset values.

In addition, the Z-axis directional target average value ($Z_{real,\ ave}$) may be a preset value and may satisfy following Equation 6.

$$Z_{real,ave} = \frac{Z_{real,1} + Z_{real,2} + \ldots + Z_{real,N}}{N} \quad \text{Equation 6}$$

In this case, when the target teaching values are acquired based on any one of a plurality of the target seating surfaces S2, an error between the Y-axis directional target teaching value ($Y_{teaching}$) and a value ($Y_{real}$) to be exactly taught may increase as an error between the Z-axis directional target real value ($Z_{real}$) on any one target seating surface S2 and the Z-axis directional target average value ($Z_{real,\ ave}$) increases. This is because the direction of photographing the target seating surface S2 by the image acquiring unit 122 is a direction crossing the gravity direction 'g', when the second mage E2 corresponding to the target seating surface S2 is acquired at the target loading/unloading position P2.

Accordingly, by taking the above into account, it may be necessary to acquire the Y-axis target correction teaching value $$(Y''_{teaching})$$

by correcting the Y-axis directional target teaching value ($Y_{teaching}$).

The Y-axis target correction teaching value $$(Y''_{teaching})$$

may satisfy Equation 7 and Equation 8.

$$\begin{cases} Y_{real} = Y''_{teaching} \\ Y''_{teaching} - Y_{teaching} = c_3(Z_{real} - Z_{real,ave}) \end{cases}, \quad \text{Equation 7}$$

where C3 is constant.

$$Y''_{teaching} = Y_{teaching} + c_3(Z_{real} - Z_{real,ave}), \quad \text{Equation 8}$$

where C3 is constant.

The proportional constant ($C_3$) used in Equation 7 and Equation 8 may be acquired through experiences repeated by a predetermined number of times and those skilled in the art may easily acquire the proportional constant ($C_3$) based on the description of the present disclosure.

Conventionally, in order to acquire the target teaching value, the manual work of the operator was necessary. Accordingly, the labor of the worker is required and much time is required to acquire the target teaching values.

However, according to the teaching method of the present disclosure, the target teaching values may be rapidly acquired without the help of the worker.

Although it has been described with reference to exemplary embodiments of the present disclosure, it will be understood to those skilled in the art that various modifications and variations are possible without departing from the idea and scope of the present disclosure described in the claims.

What is claimed is:

1. A teaching method, comprising:
- allowing a vehicle, which travels along a traveling rail, to arrive at a reference loading/unloading position that is adjacent to a reference seating surface having a reference QR code displayed thereon;
- acquiring a first image corresponding to the reference seating surface at the reference loading/unloading position;
- allowing the vehicle, which further travels along the traveling rail, to arrive at a target loading/unloading position that is adjacent to a target seating surface having a target QR code displayed thereon;
- acquiring a second image corresponding to the target seating surface at the target loading/unloading position;
- comparing the first image with the second image to acquire an X-axis directional teaching relative value and a Y-axis directional teaching relative value; and
- determining a Y-axis directional target teaching value based on the Y-axis directional teaching relative value and correcting the Y-axis directional target teaching value using correction data collected at the target loading/unloading position,
- wherein the correction data includes tilt data, and
- wherein the tilt data includes a Y-axis directional target tilting angle collected by a gradient sensor.

2. The teaching method of claim 1, wherein the X-axis directional teaching relative value is acquired based on a value obtained by subtracting a1 indicating an X-axis coordinate of the reference QR code shown on the first image from a2 indicating an X-axis coordinate of the target QR code shown on the second image.

3. The teaching method of claim 1, wherein the Y-axis directional teaching relative value is acquired based on a value obtained by subtracting b1 indicating a Y-axis coordinate of the reference QR code shown on the first image from b2 indicating a Y-axis coordinate of the target QR code shown on the second image.

4. The teaching method of claim 1, further comprising:

acquiring an X-axis directional target teaching value by adding the X-axis directional teaching relative value to an X-axis directional default value.

5. The teaching method of claim 1, wherein the determining the Y-axis directional target teaching value further includes acquiring the Y-axis directional target teaching value by adding the Y-axis directional teaching relative value to a Y-axis directional default value.

6. A teaching method, comprising:

allowing a vehicle, which travels along a traveling rail, to arrive at a reference loading/unloading position that is adjacent to a reference seating surface having a reference QR code displayed thereon;

acquiring a first image corresponding to the reference seating surface at the reference loading/unloading position;

allowing the vehicle, which further travels along the traveling rail, to arrive at a target loading/unloading position that is adjacent to a target seating surface having a target QR code displayed thereon;

acquiring a second image corresponding to the target seating surface at the target loading/unloading position;

comparing the first image with the second image to acquire an X-axis directional teaching relative value and a Y-axis directional teaching relative value;

acquiring a Y-axis directional target teaching value by adding the Y-axis directional teaching relative value to a Y-axis directional default value;

sensing a Y-axis directional target tilting angle; and correcting the Y-axis directional target teaching value based on the Y-axis directional target tilting angle to acquire a Y-axis directional target correction teaching value, wherein the Y-axis directional target correction teaching value satisfies a following equation, $$Y'_{teaching} = \frac{Y_{teaching}}{\cos\theta}, \quad \text{Equation}$$

wherein, in the Equation, $$Y'_{teaching}$$

denotes the Y-axis directional target correction teaching value, $Y_{teaching}$ denotes the Y-axis directional target teaching value, and θ denotes the Y-axis directional target tilting angle.

7. The teaching method of claim 1, further comprising:

acquiring a Z-axis directional target teaching value preset in the target QR code by scanning the target QR code, after acquiring the second image.

8. The teaching method of claim 1, wherein the correction data further includes height data.

9. The teaching method of claim 8, wherein the height data includes a Z-axis directional target teaching value preset in the target QR code by scanning the target QR code, after acquiring the second image.

10. A teaching method comprising:

allowing a vehicle, which travels along a traveling rail, to arrive at a reference loading/unloading position that is adjacent to a reference seating surface having a reference QR code displayed thereon;

acquiring a first image corresponding to the reference seating surface at the reference loading/unloading position;

allowing the vehicle, which further travels along the traveling rail, to arrive at a target loading/unloading position that is adjacent to a target seating surface having a target QR code displayed thereon;

acquiring a second image corresponding to the target seating surface at the target loading/unloading position;

comparing the first image with the second image to acquire an X-axis directional teaching relative value and a Y-axis directional teaching relative value; and correcting a Y-axis directional target teaching value based on a preset Z-axis directional target average value and a preset Z-axis directional target real value to acquire a Y-axis directional target correction teaching value.

* * * * *